United States Patent
Shirai et al.

(10) Patent No.: US 8,076,659 B2
(45) Date of Patent: Dec. 13, 2011

(54) FOIL TRAP AND EXTREME ULTRAVIOLET LIGHT SOURCE DEVICE USING THE FOIL TRAP

(75) Inventors: Takahiro Shirai, Gotenba (JP); Takahiro Inoue, Gotenba (JP)

(73) Assignee: Ushiodenki Kabushiki Kaisha, Tokyo (JP)

(*) Notice: Subject to any disclaimer, the term of this patent is extended or adjusted under 35 U.S.C. 154(b) by 407 days.

(21) Appl. No.: 12/038,970

(22) Filed: Feb. 28, 2008

(65) Prior Publication Data
US 2008/0230726 A1    Sep. 25, 2008

(30) Foreign Application Priority Data

Mar. 23, 2007 (JP) ................................. 2007-076182

(51) Int. Cl.
*G01J 3/10* (2006.01)
(52) U.S. Cl. ............... 250/504 R; 250/492.2; 355/30
(58) Field of Classification Search ............... 250/504 R
See application file for complete search history.

(56) References Cited

U.S. PATENT DOCUMENTS
| | | | |
|---|---|---|---|
| 6,359,969 B1* | 3/2002 | Shmaenok | .................. 378/156 |
| 7,247,866 B2 | 7/2007 | Bakker et al. | |
| 2004/0184014 A1* | 9/2004 | Bakker et al. | .................. 355/30 |
| 2006/0243927 A1 | 11/2006 | Tran et al. | |

FOREIGN PATENT DOCUMENTS
| | | |
|---|---|---|
| DE | 102 37 901 B3 | 5/2004 |
| EP | 1 365 636 A1 | 11/2003 |
| EP | 1 742 110 A2 | 1/2007 |
| JP | 2007-5124 A | 1/2007 |
| JP | 2007-5542 A | 1/2007 |
| WO | 2006/134512 A2 | 12/2006 |

OTHER PUBLICATIONS

Present Status and Future of EUV (Extreme Ultra Violet) Light Source Research, Mizoguchi Hakaru, Research Division, Gigaphoton Ltd., J.Plasma Fusion Res., vol. 79, No. 3 (2003) pp. 219-262.

* cited by examiner

*Primary Examiner* — Phillip A Johnston
(74) *Attorney, Agent, or Firm* — Roberts Mlotkowski Safran & Cole, P.C.; David S. Safran

(57) ABSTRACT

An extreme ultraviolet (EUV) light source device and foil trap, the device including a vessel; an EUV radiating species supply means that feeds an extreme ultraviolet radiating species into the vessel; a discharge part with discharge electrodes that heat and excite the EUV radiating species and generate a high-temperature plasma; a collector mirror collecting EUV radiation emitted from the plasma; the foil trap installed between the discharge part and the mirror; an extractor part extracting the collected radiation; and an evacuation means exhausting and regulating pressure within the vessel. The foil trap includes foils extending radially from a main axis thereof to capture debris from the light source, while allowing the emitted radiation to pass through a region thereof to the mirror. A length of at least part of the foils in directions parallel to the main axis is shorter in positions close to the main axis than distant therefrom.

6 Claims, 14 Drawing Sheets

Fig. 13(a) (Prior Art)
Fig. 13(c) (Prior Art)
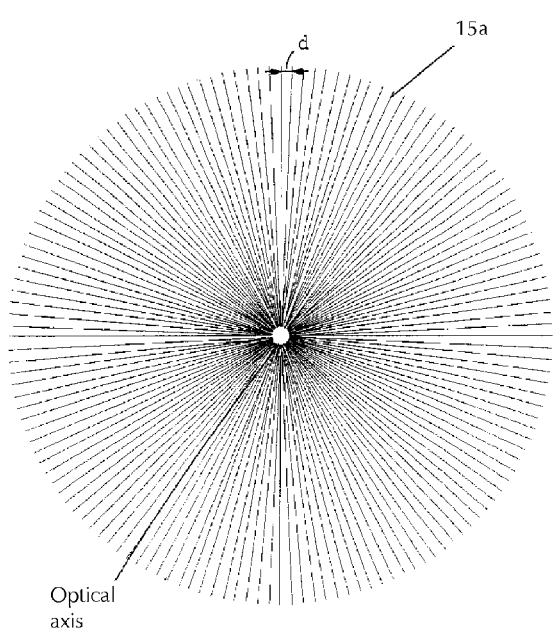
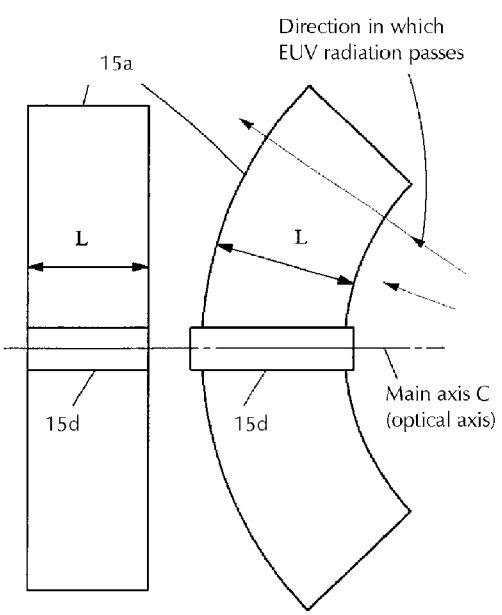
Fig. 13(b) (Prior Art)

FOIL TRAP AND EXTREME ULTRAVIOLET LIGHT SOURCE DEVICE USING THE FOIL TRAP

BACKGROUND OF THE INVENTION

1. Field of Invention

The present invention generally is related to foil traps, and more particularly to a foil trap that protects collector optics from debris released from a high-temperature plasma extreme ultraviolet light source, and an extreme ultraviolet light source using the foil trap.

2. Description of Related Art

With the micro-miniaturization and higher integration of semiconductor integrated circuits, there are demands for improved resolution in projection lithography devices used in manufacturing such integrated circuits. Accordingly, lithography light source wavelengths have gotten shorter. Therefore, there is a need for extreme ultraviolet (EUV) light source devices that emit extreme ultraviolet radiation with wavelengths from 13 nm to 14 nm, and particularly 13.5 nm, to be developed as a next-generation semiconductor lithography light source to follow excimer laser devices to meet such demands.

SUMMARY OF THE INVENTION

The above and other needs are met by the exemplary embodiments of the present invention, which provide a foil trap that protects collector optics from debris released from a high-temperature plasma extreme ultraviolet light source, and an extreme ultraviolet light source using the foil trap. In an exemplary embodiment, to increase intensity of extreme ultraviolet radiation from EUV light source devices and improve transmittance of high-intensity EUV radiation having a small angle of emission, a high-voltage pulse is applied between first and second main electrodes and a high-temperature plasma is generated for irradiation of 13.5 nm wavelength EUV radiation, which is collected by an EUV collector mirror and emitted by a radiation emitter. Debris from the plasma is captured by a foil trap and kept from accumulating on a reflective surface of the mirror. The foil trap's length in an optical axis direction is shorter at positions close to a central or main axis than positions far from the main axis, and a radiation portion intercepted by the foil is minimized. The foil trap is shaped with a concave radiation emission side to improve the emissivity of the high-intensity EUV radiation.

Accordingly, in exemplary aspects of the present invention there is provided a foil trap that is located between an extreme ultraviolet light source and a reflecting mirror that reflects extreme ultraviolet radiation emitted by the light source, including a plurality of foils extending radially from a main axis thereof, and configured to capture debris from the extreme ultraviolet light source, while allowing the emitted extreme ultraviolet radiation to pass through the foils to the reflecting mirror. In at least a portion of a region through which the extreme ultraviolet radiation passes through, a length of the foils in a direction parallel to the main axis and a direction of passage of the extreme ultraviolet radiation is shorter in positions close to the main axis than in positions distant from the main axis.

In further exemplary aspects of the present invention there is provided an extreme ultraviolet light source device, including a vessel; an extreme ultraviolet radiating species supply means that feeds an extreme ultraviolet radiating species into the vessel; a discharge part that comprises a pair of discharge electrodes that heat and excite the extreme ultraviolet radiating species and generate a high-temperature plasma; a collector mirror that collects extreme ultraviolet radiation emitted from the plasma; a foil trap installed between the discharge part and the collector mirror; an extractor part formed in the vessel that extracts the extreme ultraviolet radiation collected; and an evacuation means that exhausts the vessel and regulates pressure within the vessel. The foil trap includes a plurality of foils extending radially from a main axis thereof, and configured to capture debris from the extreme ultraviolet light source, while allowing the emitted extreme ultraviolet radiation to pass through the foils to the collector mirror. In at least a portion of a region through which the extreme ultraviolet radiation passes through, a length of the foils in a direction parallel to the main axis and a direction of passage of the extreme ultraviolet radiation is shorter in positions close to the main axis than in positions distant from the main axis.

Still other aspects, features, and advantages of the present invention are readily apparent from the following detailed description, by illustrating a number of exemplary embodiments and implementations, including the best mode contemplated for carrying out the present invention. The present invention is also capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The embodiments of the present invention are illustrated by way of example, and not by way of limitation, in the figures of the accompanying drawings and in which like reference numerals refer to similar elements and in which:

FIGS. 13(a)-(c) further illustrate the conventional foil trap of FIG. 12; and

DETAILED DESCRIPTION OF THE INVENTION

The present invention includes recognition that a number of methods of generating extreme ultraviolet (EUV) light are known in EUV light source devices, including a method in which high-temperature plasma is generated by heating and excitation of an extreme ultraviolet radiating species and extracting the EUV radiation emitted by the plasma. EUV light source devices using such method can be roughly divided by the type of high-temperature plasma production employed, into laser-produced plasma (LPP) type EUV light source devices and discharge-produced plasma (DPP) type EUV light source devices, for example, as described in "Status and Prospects of Research on EUV (Extreme Ultraviolet) Light Sources for Lithography," J. Plasma Fusion Res. Vol. 79, No. 3, p. 219-260, March 2003.

LPP-type EUV light source devices use EUV radiation from a high-temperature plasma produced by irradiating a solid, liquid, or gaseous target with a pulsed laser. DPP-type EUV light source devices, on the other hand, use EUV radiation from a high-temperature plasma produced by electrical current drive. Among the types of discharge in DPP-type EUV light sources, there are the Z pinch type, capillary discharge type, the plasma focus type, the hollow cathode triggered Z pinch type, and others, as described in "Status and Prospects of Research on EUV (Extreme Ultraviolet) Light Sources for Lithography." Compared with LPP-type EUV light sources, DPP-type EUV light sources have the advantages of smaller light source devices and lower light source system power consumption.

A radiating species that emits 13.5 nm EUV radiation (e.g., decavalent Xe (xenon) ions as a high-temperature plasma raw material for generation of EUV) is known in both the LLP and DPP types of EUV light source devices, but Li (lithium) and Sn (tin) ions have been noted as a high-temperature plasma raw material that yields a greater radiation intensity. For example, Sn has a conversion efficiency, which is the ratio of 13.5 nm wavelength EUV radiation intensity to the input energy for generating high-temperature plasma, several times greater than that of Xe.

Figure 11:
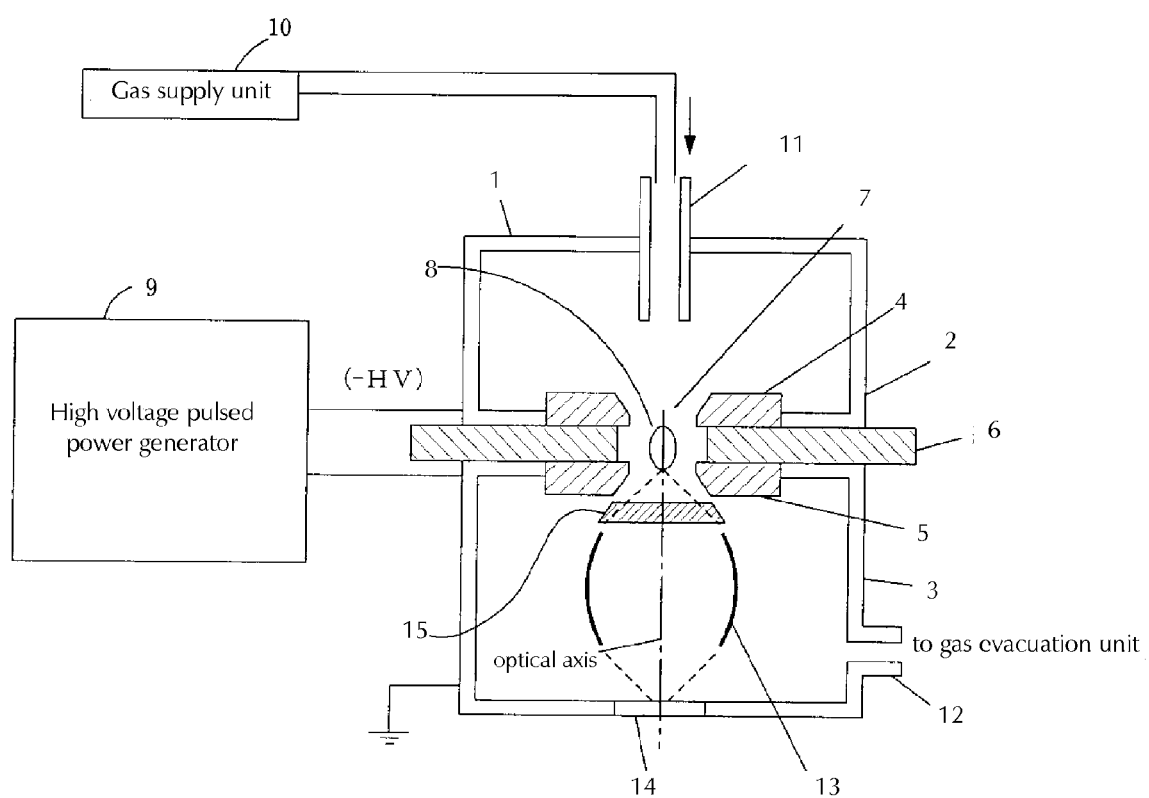
FIG. 11 illustrates an example of a DPP-type EUV light source device.

FIG. 11 shows an example of a DPP-type EUV light source device, but there are DPP-type EUV light source devices with various other constitutions, as described in "Status and Prospects of Research on EUV (Extreme Ultraviolet) Light Sources for Lithography." In FIG. 11, the DPP-type EUV light source device has a chamber 1 that is a discharge vessel. Within the chamber 1 are located, for example, a ring-shaped first main discharge electrode 4 and second main discharge electrode 5 that make up the discharge part, sandwiching a ring-shaped insulator 6. The first main discharge electrode 4 and the second main discharge electrode 5 are made of a high-melting point metal, such as tungsten, molybdenum, or tantalum, for example. The insulator 6 is made of silicon nitride, aluminum nitride, or diamond, for example.

The chamber 1 includes a first vessel 2, made of conductive material, that houses the first main discharge electrode 4, and a second vessel 3, similarly made of conductive material, that houses the second main discharge electrode 5. The first vessel 2 and second vessel 3 are separated and insulated by the insulator 6. The second vessel 3 of the chamber 1 and the second main discharge electrode 5 are grounded. A gas inlet 11 connected to a gas supply unit 10 that supplies a raw material gas that includes the EUV radiating species is installed on the first vessel 2 side of the chamber 1. The raw material gas is fed to the high-temperature plasma generation area 7 of the chamber 1 by way of the gas inlet 1.

The ring-shaped first main discharge electrode 4, second main discharge electrode 5, and insulator 6 are positioned so that their respective through holes have roughly the same axis, constituting a communication hole. When power is applied to the first main discharge electrode 4 and the second main discharge electrode 5 and discharge is generated, a high-temperature plasma 8 from the EUV radiating species is formed in or near the communication hole. In other words, the high-temperature plasma generation area 7 is positioned in or near the space surrounded by the insulator 6.

The power feed between the first main discharge electrode 4 and the second main discharge electrode 5 is handled by a high-voltage pulse generation area 9 that is connected to the first main discharge electrode 4 and the second main discharge electrode 5. A pressure monitor (not shown) that monitors pressure in the chamber (e.g., high-temperature plasma generation area pressure) is installed in the second vessel 3 side of the chamber 1. Further, an evacuation unit (not shown) that regulates pressure in the high-temperature plasma generation area and evacuates the chamber 1 is connected to a gas exhaust 12 installed on the second vessel 3 side of the chamber 1.

An EUV collector mirror 13 is installed in the second vessel 3 side of the chamber 1 and collects extreme ultraviolet radiation (EUV radiation) that is emitted from the high-temperature plasma 8 generated in the high-temperature plasma generation area 7. The EUV collector mirror 3 has, for example, multiple mirrored surfaces that are ellipsoids of revolution or paraboloids of revolution of different diameters. The mirrored surfaces are placed on the same axis with their center axes of rotation overlapping, so that their focal points are roughly the same. The mirrored surfaces are made of a metal, such as ruthenium (Ru), molybdenum (Mo), or rhodium (Rh), finely coated on a smooth-surfaced base material, such as nickel (Ni), so as to reflect EUV radiation having an angle of incidence from 0° to 25° well.

In addition, the EUV light source device has a controller (not shown). On the basis of EUV operation command the controller of the lithography equipment, the controller controls the high-voltage pulsed power generator 9, the gas supply unit 10, and the gas evacuation unit. For example, when an EUV emission instruction is received from the controller of the lithography equipment, the controller controls the gas supply unit 10, by which means a raw material gas is fed to the high-temperature plasma generation area 7 in the chamber 1.

Further, on the basis of pressure data from a pressure sensor (not shown), the controller controls the amount of raw material gas supplied by the gas supply unit 10 and the amount exhausted by the gas evacuation unit, so that the high-temperature plasma generation area 7 in the chamber 1 is at the specified pressure. The controller then controls the high-voltage pulsed power generator 9 to generate a high-temperature plasma 8 that emits EUV, by which means power is fed to the first main discharge electrode 4 and the second main discharge electrode 5.

The operation of the EUV light source equipment is as follows:

(1) Discharge gas (e.g., raw material gas) is introduced from the gas supply unit 10 by way of the gas inlet 11 installed on the first vessel 2 side. The discharge gas is a raw material gas that forms, with high efficiency, a radiating species that will emit EUV radiation with a wavelength of 13.5 nm in the high-temperature plasma generation area 7. For example, $SnH_4$ (stannane) is a possibility in the event that tin is used as the radiating species.

(2) The introduced $SnH_4$ flows to the chamber 1 side and arrives at the gas exhaust 12 installed in the second vessel 3. The gas exhaust 12 is connected to a gas evacuation unit that has gas evacuation means (not shown), such as a vacuum pump. That is, the discharge gas that reaches the gas exhaust is exhausted by the gas evacuation means of the gas evacuation unit.

(3) The pressure of the high-temperature plasma generation area 7 is regulated between 1 and 20 Pa. This pressure regulation is done, for example, as follows. First, the controller 14 receives pressure data output by a pressure monitor mounted in the chamber 1. On the basis of the pressure data received, the controller controls the gas supply unit 10 and the gas evacuation unit and adjusts the amount of $SnH_4$ supplied to the chamber 1 and the amount exhausted, thereby regulating the pressure in the high-temperature plasma generation area 7 to the specified pressure.

(4) A pulsed high voltage of roughly +20 kV to −20 kV from the high-voltage generator 9 is applied between the second vessel 3 and the second main discharge electrode 5, which are grounded, and the first vessel 2 and the first main discharge electrode 4. As a result, a creeping discharge is generated on the surface of the insulator and what is essentially a short-circuit condition is formed between the first main discharge electrode 4 and the second main discharge electrode 5, whereby a large, pulsed current flows between the first main discharge electrode 4 and the second main discharge electrode 5.

(5) Joule heating due to the pinch effect causes the generation of high-temperature plasma 8 in the high-temperature plasma generation area 7 between the ring-shaped first and second main discharge electrodes 4, and 5, and EUV radiation with a wavelength of 13.5 nm is emitted from the plasma.

(6) The emitted EUV radiation is reflected by the EUV collector mirror 13 installed on the second main discharge electrode 5 side and is emitted from the radiation emission area 14 to the irradiation area that is the optical system of the lithography equipment (not shown).

In the EUV light source device described above, a variety of debris is generated by the high-temperature plasma 8, including, for example, metal powder spattered by the plasma 8, and debris originating in the radiating species (e.g., Sn or tin compounds, in the case that stannane is used as the raw material gas). The debris collides with the EUV collection mirror 13 with high kinetic energy and abrades the reflective surface or accumulates on it, thus lowering the reflectivity of EUV radiation. Accordingly, a foil trap 15 is installed between the high-temperature plasma 8 and the EUV collector mirror 13 to trap such debris before it collides with the mirror.

The operation of the foil trap 15 is as follows:

(1) Placing of the foil trap 15 between the high-temperature plasma generation area 7 and the EUV collector mirror 13 causes space being divided by the foil, reduced conductance, and increased pressure, resulting in increases in gas density, and the probability of debris collisions. Therefore, the kinetic energy of the debris is reduced and if it does collide with the EUV collector mirror 13 it is less likely to abrade the reflective surface.

(2) The debris having less kinetic energy and reduced speed is captured by the foils or foil support of the foil trap 15, and is less likely to accumulate on the reflective surface of the EUV collector mirror 13. The foil trap 15, however, allows the passage of EUV radiation from the high-temperature plasma.

Figure 12:
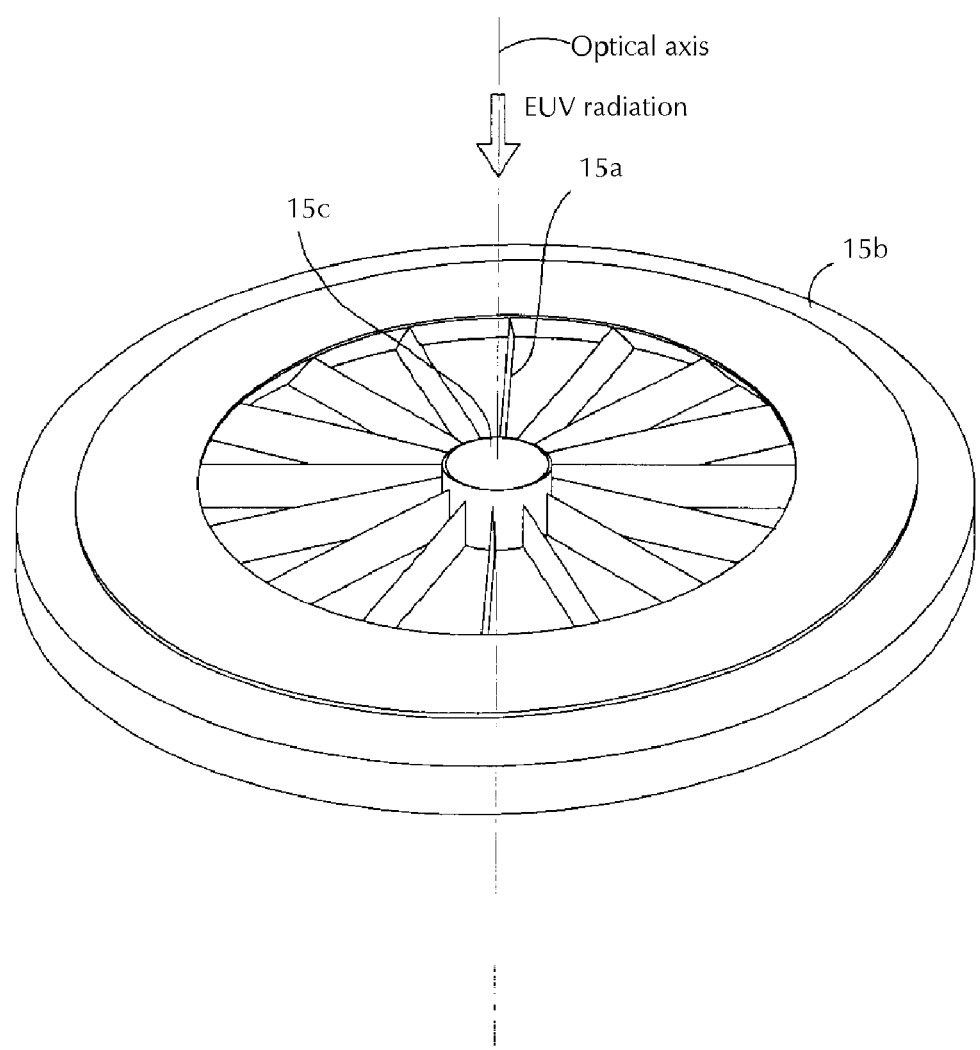
FIG. 12 illustrates an example of a conventional foil trap.

Examples of foil traps are further described in Japanese Pre-grant Patent Publication 2002-504746 and Japanese Pre-grant Patent Publication 2004-214656 U.S. Pat. No. 7,247, 866 B2). FIG. 12 illustrates the foil trap described in Japanese Pre-grant Patent Publication 2002-504746 (U.S. Pat. No. 6,359,969 B1). In FIG. 12, the foil trap 15 is centered on a central axis thereof (e.g., corresponding to the optical axis of the EUV radiation in FIG. 12) and includes multiple thin foils or thin plates 15a placed in radial form between concentric, ring-shaped supporters, including inner ring 15b and outer ring 15c, that support the thin foils or plates 15a. The foils 15a are placed and supported so that their surfaces are parallel to the optical axis of the EUV radiation. Accordingly, when the foil trap 15 is viewed from the extreme ultraviolet light source (e.g., high-temperature plasma) side, except for the inner ring 15b and outer ring 15c supports, only the thickness of the foils 15a is visible. Therefore, almost all of the EUV radiation from the high-temperature plasma is allowed to pass through the foil trap 15.

The multiple foils 15a of the foil trap 15 finely divide the space in which they are located, and therefore lower the conductance and raise the pressure in that space. Accordingly, particles of debris from the high-temperature plasma have a higher probability of collision in the region where the pressure is increased by the foil trap 15, and so their speed decreases, and some of the debris with decreased speed is captured by the foils and foil supports.

In DPP-type EUV light source devices, radiation along the optical axis (e.g., radiation that is emitted at an angle of 0° from the high-temperature plasma (e.g., a 0° angle of emission) is preferably not used for lithography. Accordingly, as inner ring 15c would pose no problem and can actively intercept radiation.

In the foil trap 15 of FIG. 12, the length in the axial direction of each foil 15a and the number of foils is set to achieve a pressure that can adequately reduce the kinetic energy of debris on the radiation incidence side of the foil trap 15. For example, the number of foils can be determined by calculating the conductance C of the foil trap 15, generally expressed by the following formula (A):

$$C = K \times d^4 \times P/L \quad (A)$$

where K is a constant, d is the diameter of the layout, L is the length of the layout, and P is the average pressure.

FIGS. 13(a)-(c) illustrate an example of the structure of the foil trap 15 of FIG. 12, where (a) is a view of the foil trap 15 as seen from the direction of the high-temperature plasma, and (b) and (c) are cross sections of a face along the central axis of the foil trap 15, wherein (b) shows a case in which rectangular foils are provided, and (c) shows a case in which fan-shaped foils are provided.

When the above formula (A) is applied to the foil trap 15 shown in FIGS. 13(a)-(c), the layout diameter d corresponds to the interval d between adjacent foils, as shown in FIG. 13. The layout length L corresponds to the length of the foils 15a in the direction that the EUV radiation passes the foils 15a. For example, the layout length L corresponds to the length L or foil width in the direction of the optical axis of the EUV radiation, as shown in FIGS. 13(b)-(c). The axis parallel to the foil surface that passes through the center of the foil trap 15, for example, corresponding to the central axis of the foil trap 15, and the axis of the center support 15d in FIGS. 13(b)-(c), can be referred to as the main axis C of the foil trap 15. The foil trap 15 normally is located on the optical axis of the EUV radiation, which is the same as the main axis C, and so the main axis C also can be referred to as the optical axis.

The greater the conductance C, the easier it is for gases to flow, and so the smaller the difference will be between the pressure on the radiation incidence side and the radiation output side of the foil trap. Conversely, the smaller the conductance C, the harder it is for gases to flow, and so the greater the difference will be between the pressure on the radiation incidence side and the radiation output side of the foil trap. According to formula (A), in order to maintain a given pressure value on the radiation incidence side of the foil trap 15, the interval d between adjacent foils is narrowed, and the conductance is reduced, wherein the number of foils 15a provided is usually set about between 100 and 500.

The present invention includes recognition that in the conventional foil trap 15, the interval d between adjacent foils grows wider as the outer edge is approached (e.g., as the distance from the main axis C is approached), and so the pressure drops as the outer edge is approached. Advantageously, the present invention includes recognition that as the interval d between adjacent foils increases, the foil width L can be increased so as to maintain pressure. By contrast, in conventional foil traps, the foil width L is constant and set on the basis of formula (A) to obtain a conductance C, causing a foil trap pressure differential depending on the interval d between adjacent foils at the outer edge of the foil trap.

Figure 14:
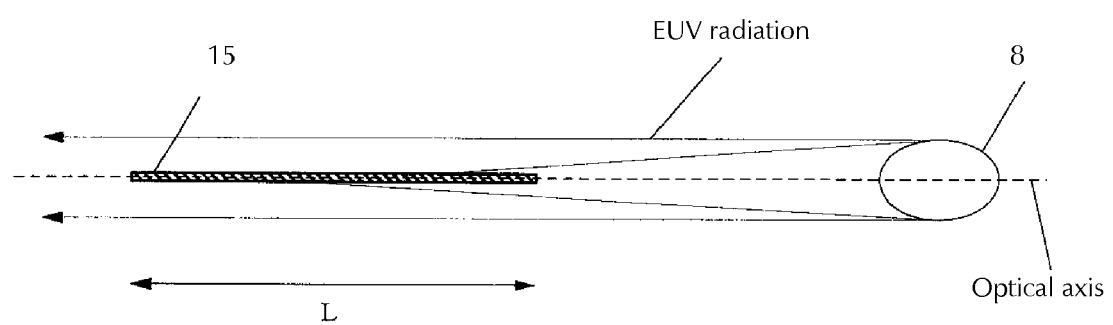
FIG. 14 is used to describe light blocked by a foil in the conventional foil trap of FIG. 12.

In addition, it is desirable the foil width L be as short as possible, as further explained with reference to FIG. 14, which shows the radiation path of the EUV radiation when the foil 15a is viewed from the direction parallel to the surface of the foil 15a. As described above, the thickness of the foil 15a of the foil trap 15 is thin and the foil 15a is placed and supported so that its surfaces are parallel to the optical axis, as shown in FIG. 14. Accordingly, if the high-temperature plasma were a small point on the optical axis, the EUV radiation emitted would be parallel or nearly parallel to the flat surface of the foils 15a and would pass through the foil trap 15.

In reality, however, the high-temperature plasma 8 generated by the electrodes has a certain size, and radiation from the high-temperature plasma 8 incident on the flat surface of the foil 15a at a slant or slanting radiation also is emitted. Accordingly, most of the radiation that slants toward the flat surface of the foil 15a is blocked by the foil 15a and does not reach the collector mirror. In particular, the closer the radiation is to the center of the foil trap or the optical axis, the narrower the interval between adjacent foils becomes and the greater the radiation portion that is blocked by the foil 15a becomes.

As noted above, radiation on the optical axis having a 0° angle of emission is not employed in DPP-type EUV light source devices, but rather an angle of emission of 5° or greater is employed and which can be reflected by the EUV collector mirror and collected. However, the intensity of the EUV radiation emitted by the high-temperature plasma 8 is greatest on the optical axis (e.g., 0° angle of emission), wherein the radiation has an angular distribution in which the intensity declines as the angle of emission increases. On the other hand, if the foil width L is short, the radiation portion blocked by the foil 15a decreases and the transmittance of EUV radiation improves, and so the intensity of EUV radiation obtained also increases. Accordingly, in order to obtain EUV radiation of the greatest intensity at the focal point of the EUV collector mirror, it is desirable to make efficient use of radiation with an angle of emission close to the optical axis (e.g., of about 5 to 20°).

As noted above, however, the closer the foil trap is to the optical axis, the greater the radiation portion blocked by the foil 15a becomes. Accordingly, there is a drop in transmittance of EUV radiation with high intensity, and a small angle of emission from the high-temperature plasma.

The present invention includes recognition of the problems described above, and provides a novel foil trap, and an extreme ultraviolet light source device using the novel foil trap, which can increase the intensity of extreme ultraviolet radiation from the EUV light source device, while maintaining the desired pressure to reduce the kinetic energy of debris, while at the same time improving the transmittance of high-intensity EUV radiation having a small angle of emission from the high-temperature plasma. Accordingly, the foil width L is determined by the interval d between adjacent foils at the outer rim of the foil trap where that interval is greatest.

As shown in FIG. 13 (a), however, the interval d between adjacent foils 15a narrows as the main axis C is approached, and in accordance with formula (A), the conductance C decreases in proportion to the 4th power of that interval d. Accordingly, if the foil width L is fixed, it is believed that conductance decreases and pressure increases greatly in the area near the main axis C. The present inventors made a variety of studies and discovered that, advantageously, the desired pressure can be maintained by decreasing the foil width L in the area near the main axis C or optical axis of the foil trap.

Thus, when the foil width L is decreased, the conductance C in that area increases. In accordance with formula (A), however, while the conductance C decreases in proportion to the 4th power of the interval d between adjacent foils when d is decreased, the conductance C increases in inverse proportion when the foil width L decreases. Accordingly, decreasing the foil width L is believed to have very little effect on conductance in the region where the interval d between adjacent foils is narrow.

According to the exemplary embodiments, a desired pressure can be maintained by decreasing the foil width L, as the interval d between adjacent foils narrows, moving inward from the outer edge of the foil trap. Because the interval d between adjacent foils is wider at the outer edge of the foil trap, the conductance C is easily affected by the length of the foil width L, and the desired pressure cannot be maintained if the foil width L is decreased at the outer edge. Accordingly, the foil width L at the outer edge of the foil trap can be kept the same length as with conventional foil traps. Advantageously, with the novel foil trap, as described above, it is possible to reduce the radiation portion blocked by the foils of the foil trap, while at the same maintaining the desired pressure on the radiation incidence side of the foil trap.

Whether a rectangular shape or fan shape, as shown in FIGS. 13(b)-(c), are employed, the above advantageous effects can be achieved by making the length of the foil in the direction parallel to the main axis C or in the direction that the EUV radiation passes shorter in positions near the main axis C than in positions far from the main axis C, in at least a portion of the region through which the EUV radiation passes.

Thus, based on the above discussion, the exemplary embodiments solves the above problems and other problems, for example, in the following ways:

(1) In at least a part of the region through which extreme ultraviolet radiation passes, the length of the foils in the direction parallel to the main axis and the direction of passage of the extreme ultraviolet radiation is shorter in positions close to the main axis than in positions distant from the main axis.

(2) The distance from the light source to the edge of the foil that faces the light source is greater in positions close to the main axis than in positions distant from the main axis. For example, the edge of the foil on the radiation incidence side becomes more distant from the plasma as it approaches the main axis.

(3) The foil trap is used in an extreme ultraviolet light source device that has a vessel, an extreme ultraviolet radiating species supply means that feeds extreme ultraviolet radiating species into the vessel, a discharge part that includes a pair of discharge electrodes that heat and excite the extreme ultraviolet radiating species and generate a high-temperature plasma, a collector mirror that collects the extreme ultraviolet radiation emitted from the plasma, the foil trap installed between the discharge part and the collector mirror, an extractor part formed in the vessel that extracts the extreme ultraviolet radiation collected, and an evacuation means that exhausts the vessel and regulates the pressure within the vessel.

The following effects can be obtained by the exemplary embodiments:

(1) Because the length of the foils in the direction parallel to the main axis and the direction of passage of the extreme ultraviolet radiation is shorter in positions close to the main axis than in positions distant from the main axis in at least a part of the region through which extreme ultraviolet radiation passes, it is possible to reduce the radiation portion blocked by the foils of the foil trap, while maintaining pressure on the radiation incidence side of the foil trap at the desired value. For example, because the foil width decreases as the optical axis is approached, the transmittance of high-intensity EUV radiation with a small angle of emission from the high-temperature plasma can be improved and the intensity of the EUV radiation obtained can be increased.

(2) Because the distance from the light source to the edge of the foil that faces the light source is greater in positions close to the main axis than in positions distant from the main axis, the EUV radiation from the high-temperature plasma is incident on positions further from the main axis of the foil trap than with conventional foil traps. For example, the radiation is incident on positions where the interval between adjacent foils is wider. Advantageously, the transmittance of EUV radiation is further improved and the intensity of EUV radiation from the extreme ultraviolet light source device is further increased.

Figure 1A:
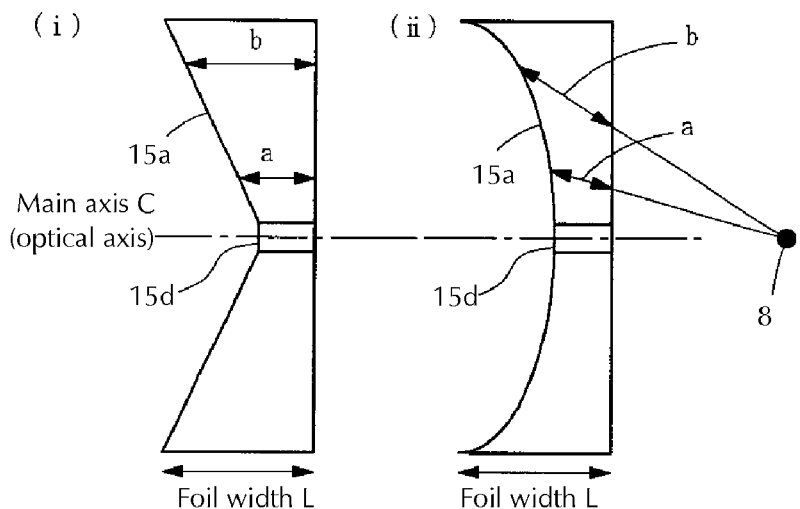
FIGS. 1(a)-(c) illustrate basic shapes of foils of an exemplary foil trap, according to the present invention.
Figure 1B:
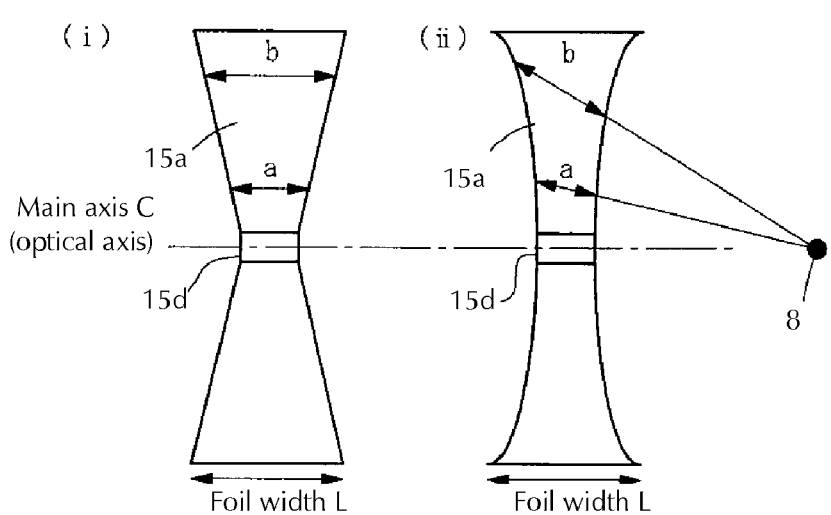
Figure 1C:
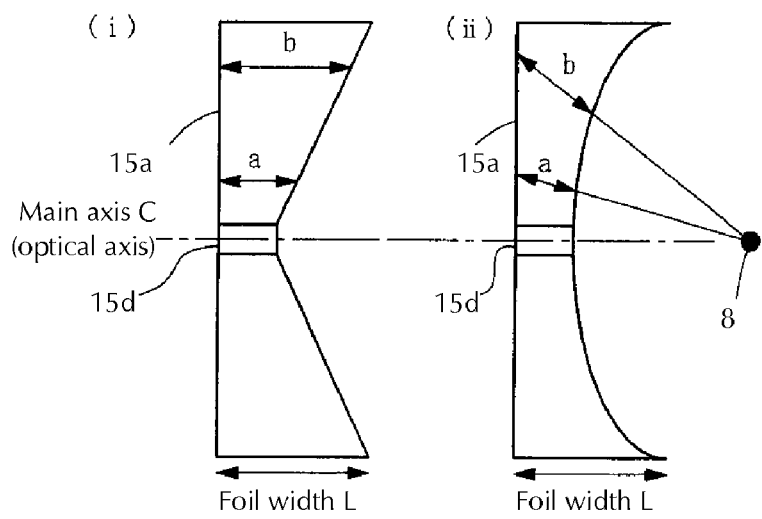

FIGS. 1(a)-(c) illustrate exemplary shapes of the foils of the novel foil trap 15 of the exemplary embodiments and are cross sections of the foil trap in a plane along the main axis. In FIG. 1(a)(i)-(ii), the edge of the foil 15a that is nearer to the light source 8 (e.g., plasma) is a straight line in a plane perpendicular to the main axis C, and the edge that is further from the light source 8 is a straight line or an arc. The width of the foil (e.g., the length in the direction following the main axis C or the length in the direction that the EUV radiation travels) is such that the length a in positions closer to the main axis C is shorter than the length b in positions further from the main axis C. For example, the radiation emission side of the foil trap can be concave.

In FIG. 1(b)(i)-(ii), both the edge of the foil 15a that is nearer to the light source 8 (e.g., plasma) and the edge that is further from the light source 8 is a straight line or an arc. The width of the foil (e.g., the length in the direction following the main axis C or the length in the direction that the EUV radiation travels) is such that the length a in positions closer to the main axis C is shorter than the length b in positions further from the main axis C. For example, both the radiation incidence side and the radiation emission side of the foil trap can be concave.

In FIG. 1(c)(i)-(ii), the edge of the foil 15a that is further from the light source 8 (e.g., plasma) is a straight line in a plane perpendicular to the main axis C, and the edge that is nearer to the light source 8 is a straight line or an arc. The width of the foil (e.g., the length in the direction following the main axis C or the length in the direction that the EUV radiation travels) is such that the length a in positions closer to the main axis C is shorter than the length b in positions further from the main axis C. For example, the radiation incidence side of the foil trap can be concave.

Figure 2A:
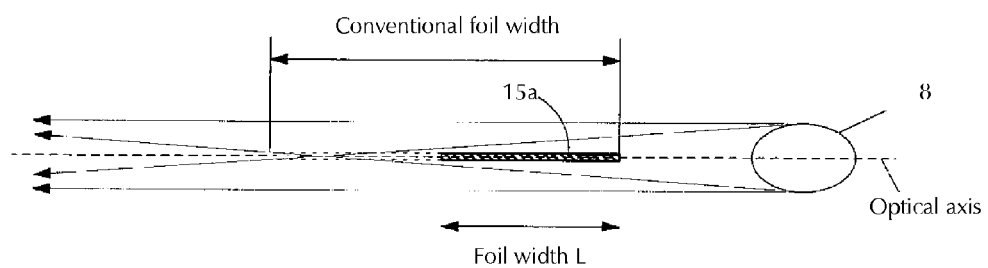
FIGS. 2(a)-(c) are used to describe light blocked by foils in the exemplary foil trap, according to the present invention.
Figure 2B:
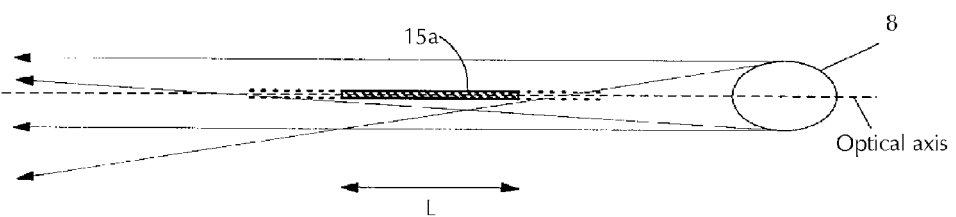
Figure 2C:
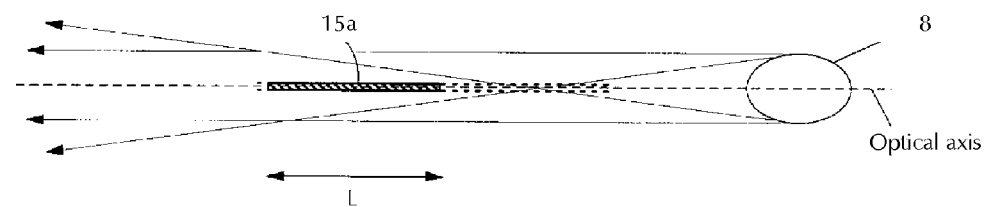

Advantageously, by forming the foils 15a as shown in FIGS. 1(a)-(c), it is possible to reduce the blocked amount of the slanting radiation incident on the foil trap, as described with respect to FIGS. 2(a)-(c), which correspond to FIGS. 1(a)-(c) respectively. In FIGS. 2(a)-(c), the radiation path of EUV radiation when viewing a foil 15a from the direction of the plane of the foil 15a is shown. As shown in FIGS. 2(a)-(c), the width of the foil 15a in positions toward the inside of the foil trap and near the main axis C is shorter than with conventional foil traps, and so the radiation portion blocked by the foil 15a can be reduced. Advantageously, the transmittance of high-intensity EUV radiation with a small angle of emission from the high-temperature plasma is improved, and so the intensity of the EUV radiation obtained is increased.

Figure 3A:
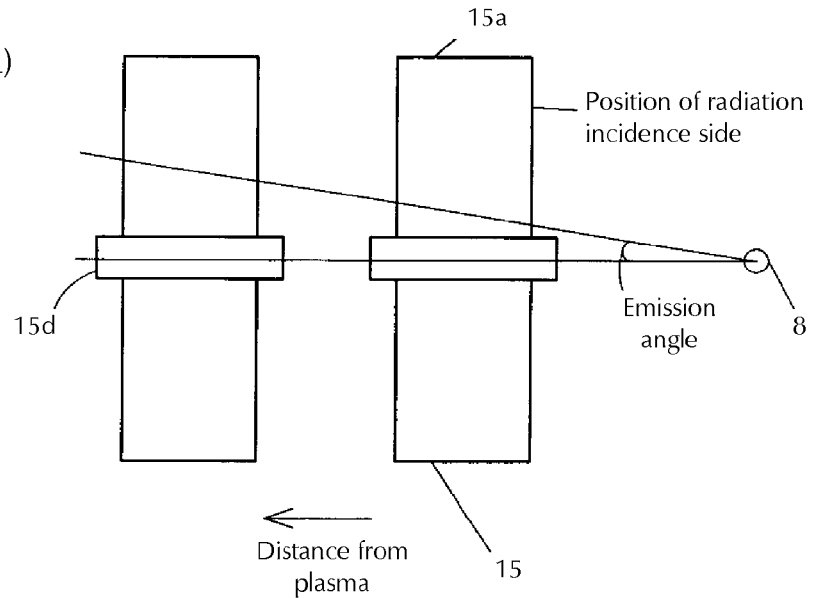
FIGS. 3(a)-(b) are used to describe how EUV radiation transmittance is improved by the exemplary foils of FIGS. 1(b) and (c)
Figure 3B:
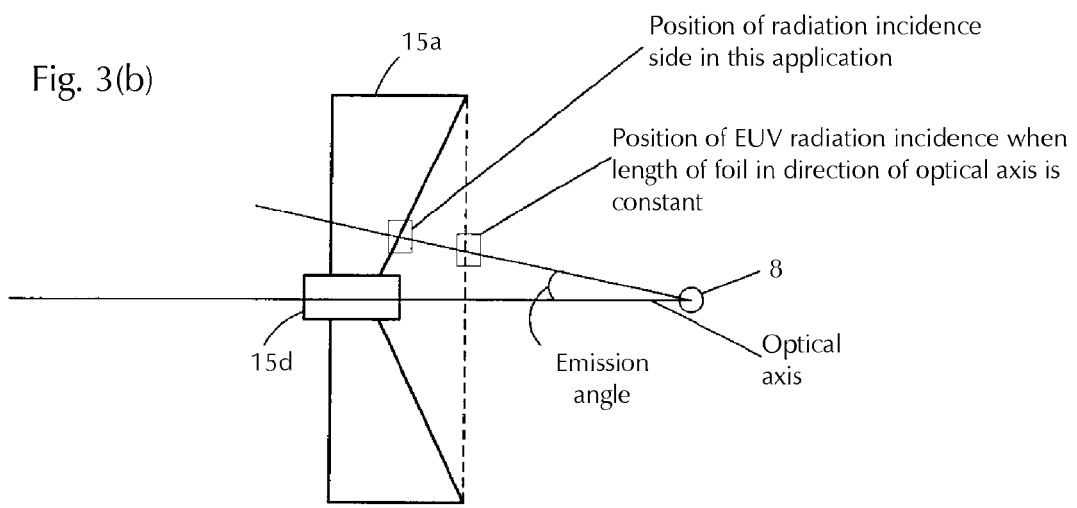

As shown in FIGS. 1(a)-(b), by placing foil 15a such that the distance from the high-temperature plasma 8 to the edge of the foil 15a increases as the main axis C is approached (e.g., such that the radiation incidence side of the foil trap is concave), it is possible to further improve the transmittance of the EUV radiation. For example, as shown in FIGS. 3(a)-(b), the closer to the center of the foil trap, which is the main axis C, the narrower the interval between adjacent foils will be, and the smaller the opening per unit area (e.g., transmittance) will be. As the main axis C is approached, the transmittance of EUV radiation declines for that same reason.

As described above, EUV radiation with a smaller angle of emission has a greater intensity. The openness of the foil trap, however, declines as the main axis C is approached. Accordingly, the transmittance of high-intensity EUV radiation with a small angle of emission from the high-temperature plasma is lower and the intensity of the EUV radiation obtained is smaller.

Even if the angle of emission is the same, as shown in FIG. 3(a), making the edge of the foil 15a further from the high-temperature plasma causes the EUV radiation to strike positions further away from the main axis C of the foil trap 15. Accordingly, the further the edge of the foil 15a on the radiation incidence side is from the high-temperature plasma 8, the more the transmittance of high-intensity EUV radiation with a small angle of emission from the high-temperature plasma will be improved. However, simply locating the foil trap 15 further from the high-temperature plasma 8 is not feasible, because this would lead to enlargement of the device. Therefore, the edge of a foil 15a on the radiation incidence side is formed, as shown in FIG. 3(b), so that as the main axis C is approached, the edge is further from the plasma or the distance from the light source to the foil 15a is longer in positions near to the main axis C than in positions far from the main axis C. Advantageously, with the exemplary embodiments, the high-intensity EUV radiation with a small angle of emission from the high-temperature plasma can be made incident on positions further from the main axis C of the foil trap and the transmittance of the EUV radiation can be improved.

Figure 4:
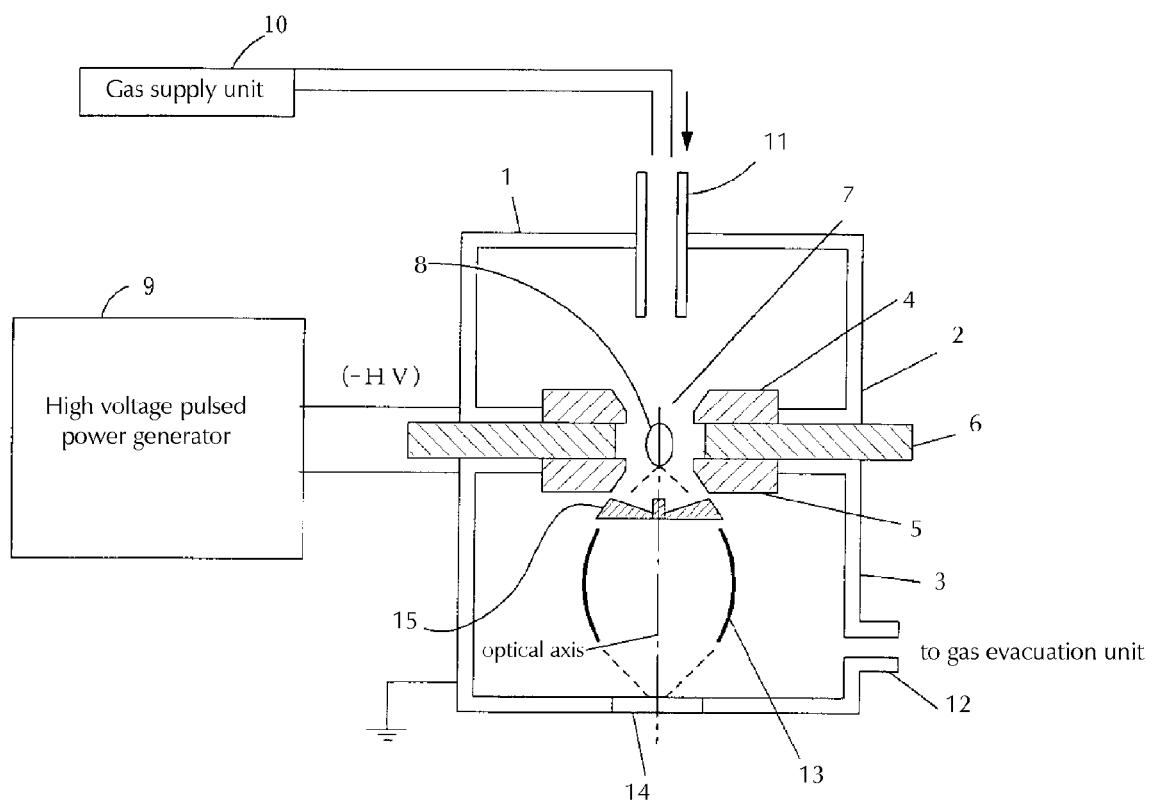
FIG. 4 illustrates an exemplary embodiment of an EUV light source device using the exemplary foil trap, according to the present invention.

FIG. 4 illustrates the exemplary EUV light source device fitted with a novel foil trap 15 configured so that the radiation incidence side of the foil trap is concave, as shown in FIG. 1(c). The configuration of the light source device, aside from the novel shape of the foils of the foil trap and the mechanism of EUV radiation generation, is similar to the device described with respect to FIG. 11. In FIG. 4, the foil trap 15 is shown in a cross section view to facilitate understanding of the shape of the foils.

As previously described, $SnH_4$ is fed into the chamber 1, and a pulsed high voltage of about +20 kV to −20 kV from the high-voltage pulsed power generator 9 is applied between the first main discharge electrode 4 and the second main discharge electrode 5. As a result, a large current in pulsed form flows between the first main discharge electrode 4 and the second main discharge electrode 5, and a high-temperature plasma 8 is generated in the high-temperature plasma generation area 7 between the first and second main discharge electrodes 4 and 5, wherein EUV radiation with a wavelength of about 13.5 nm is emitted by the plasma.

The EUV radiation emitted is reflected by the EUV collector mirror 13 mounted on the second main discharge electrode 5 side, and is emitted from the radiation emission area 14 to an irradiation area that is the optical system on the lithography side (not shown). A variety of debris is generated by the high-temperature plasma 8, but the novel foil trap 15 is located between the high-temperature plasma generation area 7 and the EUV collector mirror 13, and by which the kinetic energy of the debris is reduced, the debris is captured by the foils or foil supports of the foil trap 15. Advantageously, it becomes difficult for debris to accumulate on the reflective surface of the EUV collector mirror 13.

In the above exemplary embodiment, the foil width is shorter in positions nearer to the main axis C than in positions further from the main axis C, and so it is possible to reduce the radiation portion blocked by the foils of the foil trap 15, while at the same time maintaining the desired value of pressure on the radiation incidence side of the foil trap. In addition, with the foil trap configured so that the radiation incidence side of the foil trap is concave, the high-intensity EUV radiation with a small angle of emission from the high-temperature plasma can be incident on positions further from the main axis C of the foil trap 15.

Figure 5A:
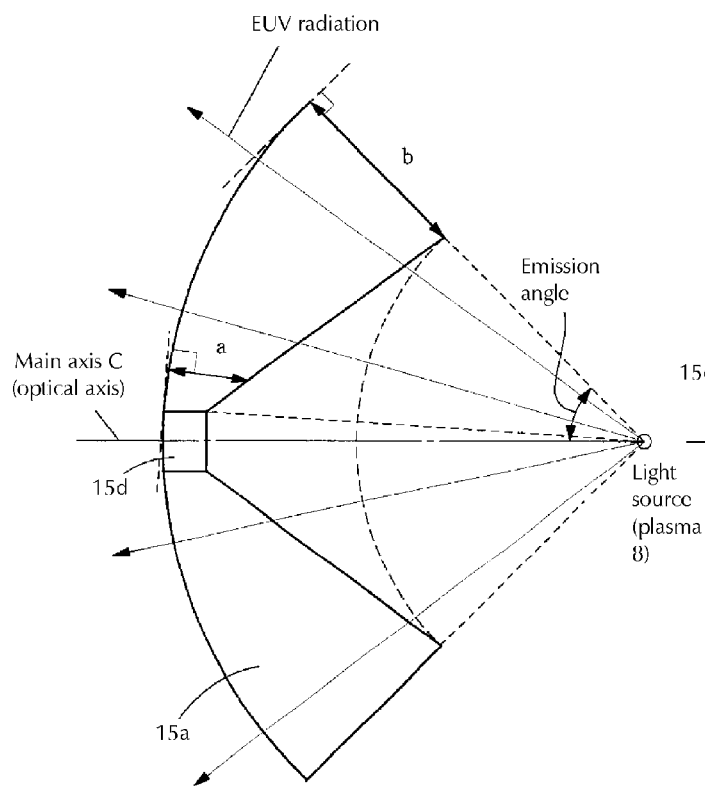
FIGS. 5(a)-(b) illustrate a further exemplary embodiment of the exemplary foil trap, according to the present invention.
Figure 5B:
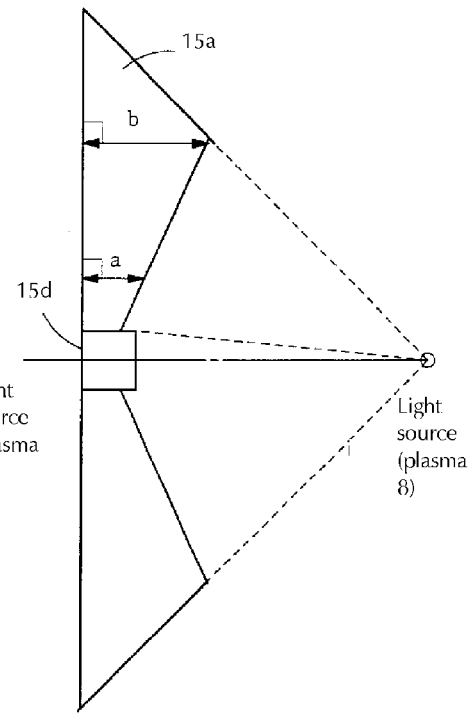

Further exemplary embodiments based on the shapes of foils 15a in FIG. 1(c) are shown in FIGS. 5(a)-(b), 6(a)-(b), 7(a)-(b), and 8(a)-(b). For example, in FIG. 5(a), the edge further from the plasma 8 is an arc and the nearer edge is straight, wherein the foil width of the portion closer to the main axis C is shorter than the width of the portion further from the optical axis. In FIG. 5(b), both the edge further from the plasma and the nearer edge are straight lines, forming a triangular shape, wherein the width of the portion closer to the main axis C is shorter than the width of the portion further from the optical axis.

Figures 6A, 6B:
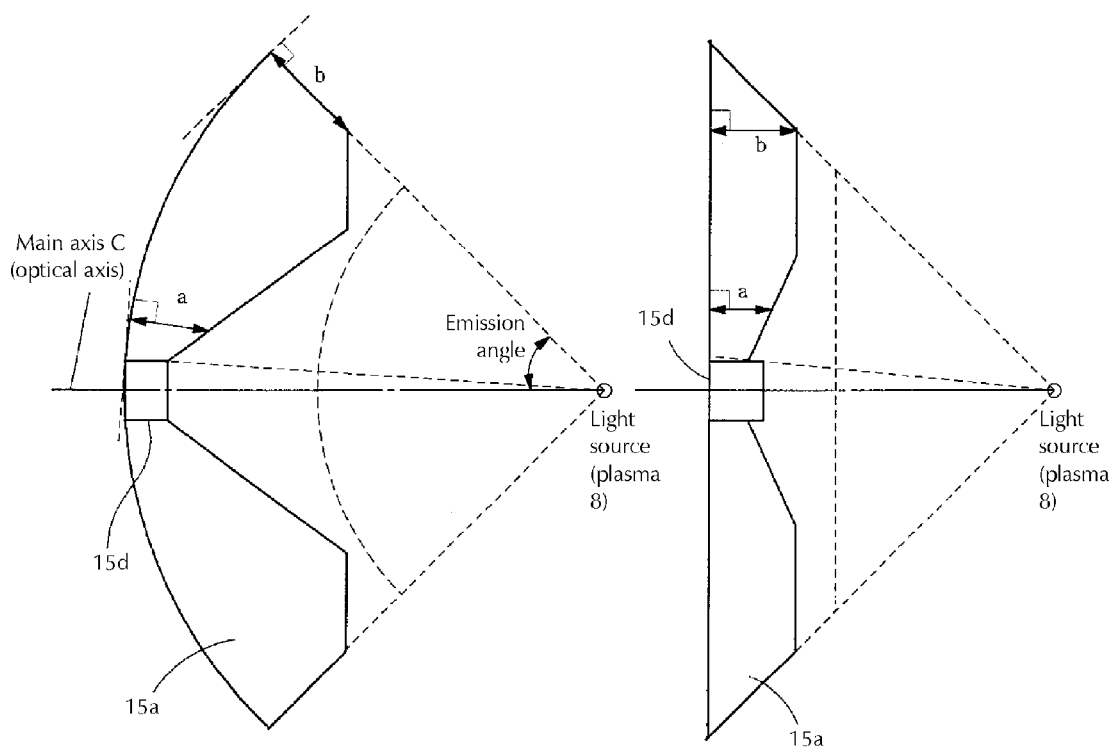
FIGS. 6(a)-(b) illustrate a further exemplary embodiment of the exemplary foil trap, according to the present invention.

In FIG. 6(a), the edge further from the plasma 8 is an arc and the nearer edge is straight, wherein the foil width of the portion closer to the main axis C is shorter than the width of the portion further from the optical axis, only in the area close to the optical axis where the EUV radiation intensity is high. In FIG. 6(b), both the edge further from the plasma and the nearer edge are straight lines, and the width of the portion closer to the main axis C is shorter than the width of the portion further from the optical axis, only in the area close to the optical axis where the EUV radiation intensity is high. The angle of emission in FIGS. 5-6 is the angle at which EUV radiation is emitted.

Figures 7A, 7B:
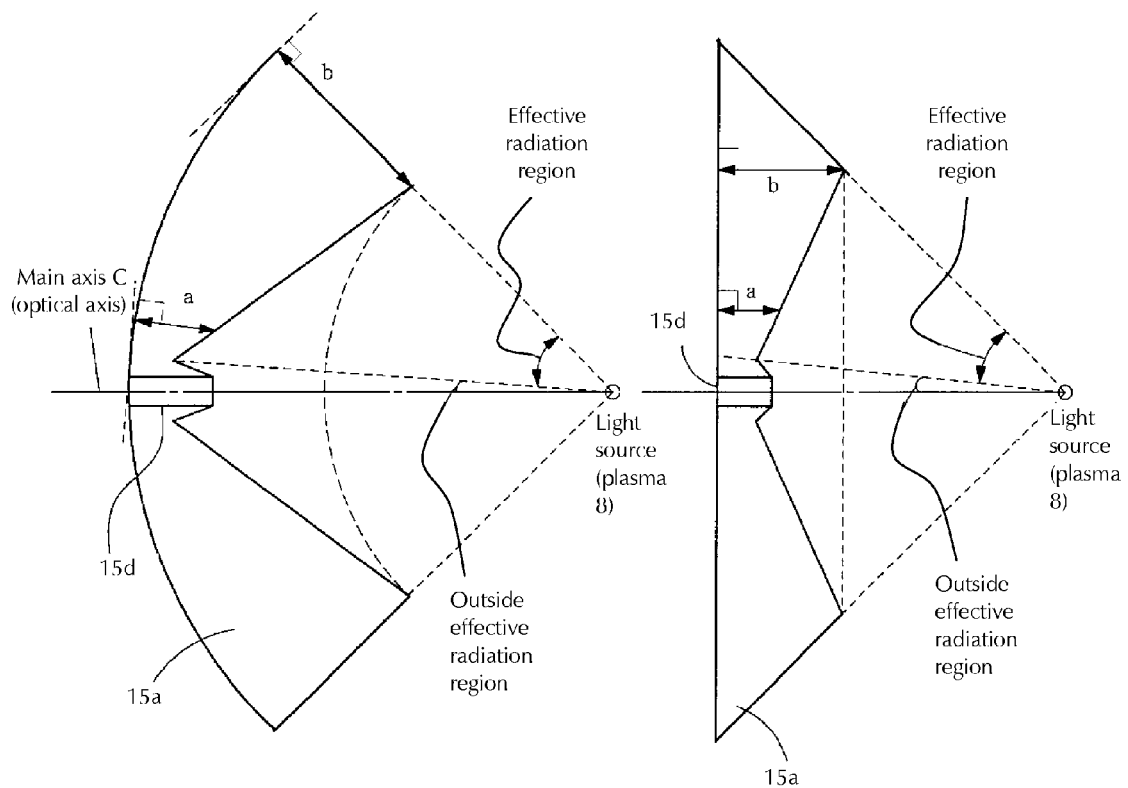
FIGS. 7(a)-(b) illustrate a further exemplary embodiment of the foil trap, according to the present invention.

In FIG. 7(a), the edge further from the plasma 8 is an arc and the nearer edge is straight, wherein the foil width of the portion of the foil 15a that receives radiation that is very close to the optical axis and is not reflected by the collector mirror (e.g., outside the effective radiation range) is increased slightly, but other portions (e.g., the effective radiation range) have the same configuration as in FIG. 5(a).

In FIG. 7 (b), both the edge further from the plasma and the nearer edge are straight lines, wherein the foil width of the portion of the foil 15a that receives radiation that is very close to the optical axis and is not reflected by the collector mirror (e.g., outside the effective radiation range) is increased slightly, but other portions (e.g., the effective radiation range) have the same configuration as in FIG. 5(b). Advantageously, when such a shape is employed, the foils 15a are easily fitted to the center support on the optical axis when the foil trap is assembled, and the strength of the foils 15a can be increased.

Figures 8A, 8B:
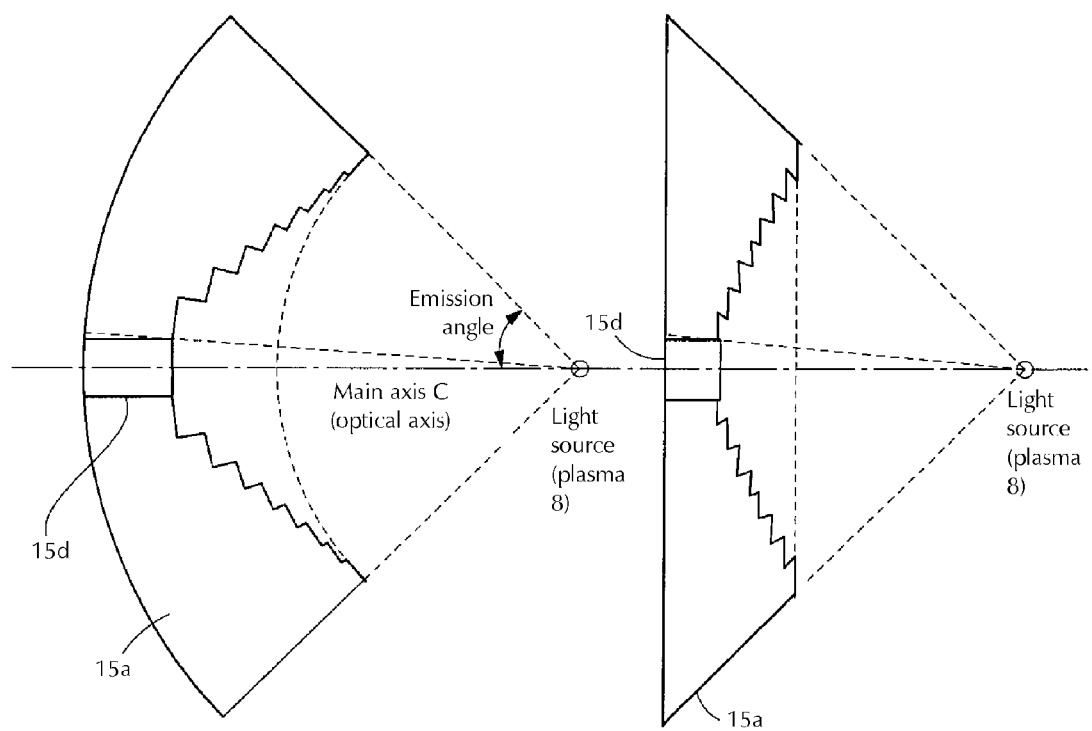
FIGS. 8(a)-(b) illustrate a further exemplary embodiment of the exemplary foil trap, according to the present invention.

In FIG. 8(a), the edge further from the plasma 8 is an arc and the nearer edge is stepped, wherein the foil width of the portion closer to the main axis C is shorter than the width of the portion further from the optical axis. In FIG. 8(b), the edge further from the plasma is straight and the nearer edge is stepped, and the width of the portion closer to the main axis C is shorter than the width of the portion further from the optical axis.

Figure 9:
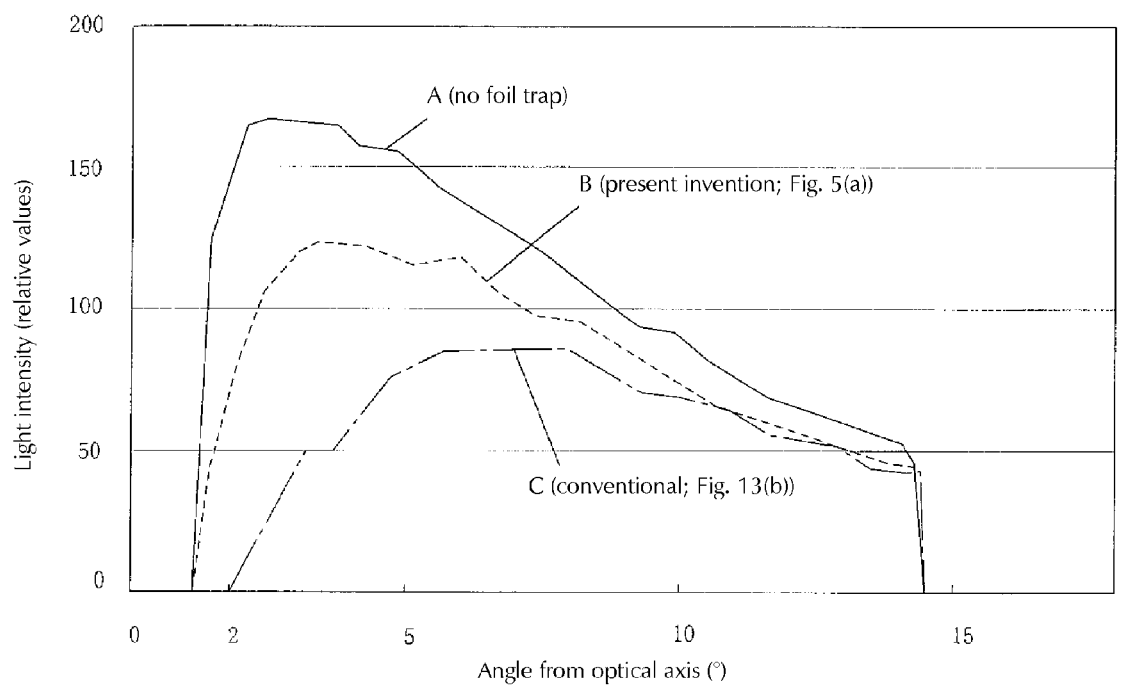
FIG. 9 is a graph of intensity of EUV radiation with no foil trap, a conventional foil trap, and the exemplary foil trap, according to the present invention.

FIG. 9 graphs the intensity of EUV radiation with no foil trap, with a conventional foil trap, and with the novel foil trap of the exemplary embodiments described with respect to FIG. 4. In FIG. 9, the horizontal axis represents the angle from the optical axis, and the vertical axis represents the intensity (e.g., relative value) of the EUV radiation. The angle from the optical axis refers to the angle of incidence in the collector mirror. Curve A is the intensity of EUV radiation when no foil trap is employed, curve B is the intensity of EUV radiation when the novel foils of FIG. 5(a) are employed, and curve C is the intensity of EUV radiation when the conventional foil of FIG. 13(b) is employed. As can be seen from FIG. 13, when the conventional foils of FIG. 13(b) are employed, hardly any radiation having an angle of emission near the optical axis (e.g., up to 2°, for example) passes. By contrast, when the novel foil of FIG. 5(a) is employed, the intensity of EUV radiation with an emission angle close to the optical axis is greater, and advantageously, the transmittance of EUV radiation is greatly improved.

Figure 10:
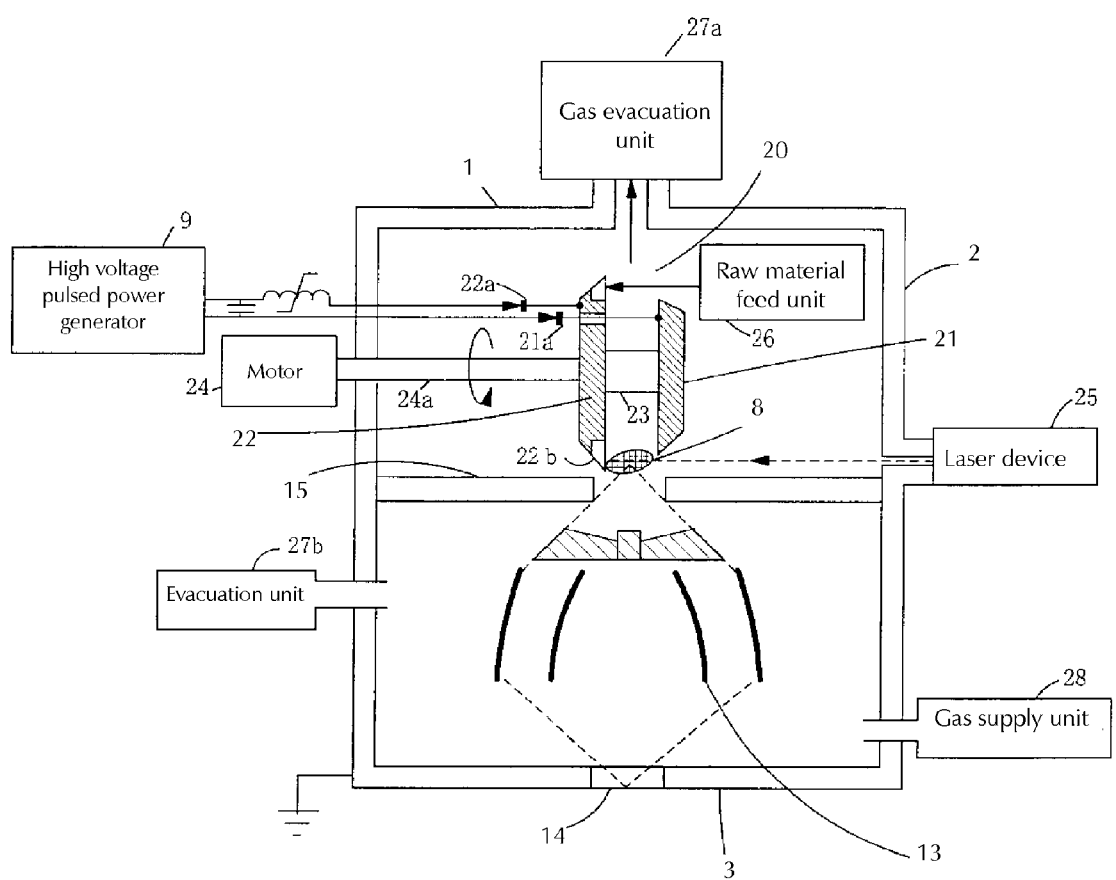
FIG. 10 illustrates a further exemplary embodiment of the exemplary EUV light source device using the exemplary foil trap, according to the present invention.

FIG. 10 illustrates a EUV light source device, according to a further exemplary embodiment, fitted with a novel foil trap 15 configured so that the radiation incidence side of the foil trap is concave, as shown in FIG. 1(c). In FIG. 10, a configuration employing rotating electrodes in the discharge area is employed, and as in the previous exemplary embodiment, the foil trap 15 is placed between the discharge area 20 that generates a high-temperature plasma 8 and an EUV collector mirror 13. The chamber 1 includes a first vessel 2, where the discharge area 20 is located, and a second vessel 3, where the EUV collector mirror 13 is installed. The chamber 1 is connected to evacuation units 27a, and 27b to exhaust the first vessel 2 and the second vessel 3, and to a gas supply unit 28 that supplies buffer gases, and the like.

The discharge area 20 includes a metal, disk-shaped first discharge electrode 21, and second discharge electrode 22, which are placed so as to sandwich an insulator 23. The center of the first discharge electrode 21 and the center of the second discharge electrode 22 are located on roughly the same axis, and the first discharge electrode 21 and the second discharge electrode 22 are fixed in place, separated only be the thickness of the insulator 23. The diameter of the second discharge electrode 22 is slightly larger than the diameter of the first discharge electrode 21. In addition, the thickness of the insulator 23 or the distance separating the first discharge electrode 21 and the second discharge electrode 22 is about 1 mm to 10 mm.

A rotor shaft 24a of a motor 24 is attached to the second discharge electrode 22, wherein the rotor shaft 24a is attached roughly to the center of the second discharge electrode 22 so that the center of the first discharge electrode 21 and the center of the second discharge electrode 22 are positioned on roughly the same axis, which is the axis of rotation. The rotor shaft 24a is introduced into the chamber 1, for example, by way of a mechanical seal. The mechanical seal permits rotation of the rotor shaft, while at the same time maintaining a reduced pressure atmosphere within the chamber 1.

On one surface of the second discharge electrode 22, there are a first wiper 21a and a second wiper 22a that include, for example, carbon brushes, and the like. The second wiper 22a is electrically connected to the second discharge electrode 22. The first wiper 21a passes through a through hole that pierces the second discharge electrode 22 and is electrically connected to the first discharge electrode 21. An insulating mechanism (not shown) is provided and configured so that there is no dielectric breakdown between the first wiper 21a, which is electrically connected to the first discharge electrode 21, and the second discharge electrode 22.

The first wiper 21a and the second wiper 22a are electrical contacts that maintain electrical connections while wiping, wherein they are connected to the high-voltage pulsed power generator 9. The high-voltage pulsed power generator 9 supplies pulsed power between the first discharge electrode 21 and the second discharge electrode 22 by way of the first wiper 21a and the second wiper 22a. For example, even though the first discharge electrode 21 and the second discharge electrode 22 are rotated by the operation of the motor 24, pulsed power from the high-voltage pulsed power generator 9 is applied between the first discharge electrode 21 and the second discharge electrode 22, by way of the first wiper 21a and the second wiper 22a.

The high-voltage pulsed power generator 9 applies pulsed power with a short pulse duration between the first discharge electrode 21 and the second discharge electrode 22, which are the load, by way of an electric pulse compression circuit (not shown) that includes capacitors and magnetic switches. The wiring from the high-voltage pulsed power generator 9 and the first wiper 21a and the second wiper 22a is done by way of insulated current introduction terminals (not shown). The current introduction terminals are mounted in the chamber 1, and enable electrical connections from the high-voltage pulsed power generator 9 and the first wiper 21a and the second wiper 22a, while at the same time maintaining a reduced pressure atmosphere within the chamber 1.

An edge shape is formed on the periphery of the metal, disk-shaped first discharge electrode 21 and second discharge electrode 22. As further described, a discharge is generated between the edge-shaped portions of the first discharge electrode 21 and the second discharge electrode 22 when power from the high-voltage pulsed power generator 9 is applied between the electrodes 21, and 22. The electrodes 21, and 22 reach a high temperature because of the high-temperature plasma, and so the first main discharge electrode 21 and the second main discharge electrode 22 are made of a metal with a high melting point, such as tungsten, molybdenum, or tantalum. The insulator can be made of a material, such as silicon nitride, aluminum nitride, or diamond.

Slots can be formed on the periphery of the second discharge electrode 22, wherein solid Sn or solid Li can be fed to these slots as the EUV radiating species. The EUV radiating species is fed by the raw material supply unit 26. In the event that a raw material supply unit 26 is employed, the raw material Sn or Li, which is the EUV radiating species, is heated and liquefied, and is fed to the slots 22b of the second discharge electrode 22. In this case, the EUV light source device is configured with the raw material supply unit 25 on the upper side and the EUV radiation emission area 14 and positioned on the side. For example, the EUV light source device shown in FIG. 10 can be rotated 90 degrees counter-clockwise.

The raw material supply unit 26 can be constituted so as to feed solid Sn or Li to the slots on the second discharge electrode 22 periodically. The motor 24 typically turns in one direction, wherein the rotor shaft 24a rotates because of operation of the motor 24, and the second discharge electrode 22 and the first discharge electrode 21 mounted on the rotor shaft 24a also rotate in a same direction, and which moves the Sn or Li that has been fed to the slots on the second discharge electrode 22. Within the chamber 1 there also is provided a laser device 25 that irradiates, with a laser beam, the Sn or Li that is moved to the EUV radiation collection side by rotation of the second discharge electrode 22. The laser beam from the laser device 25 passes through a laser aperture and laser beam collection means (not shown), is collected, and irradiates the Sn or Li that has been moved to the EUV radiation collection side.

As described above, the diameter of the second discharge electrode 22 is greater than the diameter of the first discharge electrode 21. Accordingly, the laser beam can easily be aligned to go past the side of the first discharge electrode 21 and irradiate the slots of the second discharge electrode 22.

Emission of EUV radiation from the discharge area 20 is performed in the following way:

A laser beam from the laser device 25 irradiates the Sn or Li. The Sn or Li irradiated by the laser beam is gasified between the first discharge electrode 21 and the second discharge electrode 22, and a portion thereof ionizes. In this state, pulsed power with a voltage of about +20 kV to −20 kV from the high-voltage pulsed power generator 9 is applied to first and second discharge electrodes 21, and 22, at which time a discharge is generated between the edge-shaped portions of the first discharge electrode 21 and the second discharge electrode 22. As a result, large pulsed current flows through the ionized portion of the gasified Sn or Li between the first discharge electrode 21 and the second discharge electrode 22. Then, Joule heating due to the pinch effect causes a high-temperature plasma 8 of gasified Sn or Li to form between the edges of the two electrodes, and EUV radiation with a wavelength of about 13.5 nm is emitted by this high-density, high-temperature plasma 8. The emitted radiation passes through the foil trap 15 and enters the EUV collector mirror 13, wherein the radiation is collected to a intermediate focus point, and emitted outside the EUV light source device through the EUV radiation emission area 14.

Once again, although a variety of debris is generated by the high-temperature plasma 8, the novel foil trap 15 is located between the high-temperature plasma generation area 7 and the EUV collector mirror 13 and by which the kinetic energy of the debris is reduced, and the debris is captured by the foils or supports of the foil trap 15, and cannot easily accumulate on the reflective surface of the EUV collector mirror 13. In this exemplary embodiment, as in the exemplary embodiment shown in FIG. 4, it is possible to reduce the radiation portion blocked by the foils of the foil trap, while at the same time maintaining the desired value of pressure on the radiation incidence side of the foil trap 15. In addition, the novel foil trap 15 is configured so that its radiation incidence side is concave, and so that high-intensity EUV radiation with a small angle of emission can be incident on positions further from the main axis C of the foil trap, and the transmittance of the EUV radiation can be improved.

While the present inventions have been described in connection with a number of exemplary embodiments, and implementations, the present inventions are not so limited, but rather cover various modifications, and equivalent arrangements, which fall within the purview of the present claims.

What is claimed is:

1. A foil trap that is located between an extreme ultraviolet light source and a reflecting mirror that reflects extreme ultraviolet radiation emitted by the light source, comprising:

a plurality of foils extending radially from a main axis thereof, and configured to capture debris from the extreme ultraviolet light source while allowing the emitted extreme ultraviolet radiation to pass through the foils to the reflecting mirror, wherein, in at least a portion of a region through which the extreme ultraviolet radiation passes through, a length of the foils in a direction parallel to the main axis and a direction of passage of the extreme ultraviolet radiation is shorter in positions close to the main axis than in positions distant from the main axis.

2. The foil trap of claim 1, wherein a distance from the light source to edges of a foil of the plurality of foils that faces the light source is greater in positions close to the main axis than in positions distant from the main axis.

3. An extreme ultraviolet light source device, comprising:
a vessel;
an extreme ultraviolet radiating species supply means that feeds an extreme ultraviolet radiating species into the vessel;
a discharge part that comprises a pair of discharge electrodes that heat and excite the extreme ultraviolet radiating species and generate a high-temperature plasma;
a collector mirror that collects extreme ultraviolet radiation emitted from the plasma;
a foil trap installed between the discharge part and the collector mirror;
an extractor part formed in the vessel that extracts the extreme ultraviolet radiation collected; and
an evacuation means that exhausts the vessel and regulates pressure within the vessel, wherein the foil trap includes:
a plurality of foils extending radially from a main axis thereof, and configured to capture debris from the extreme ultraviolet light source, while allowing the emitted extreme ultraviolet radiation to pass through the foils to the collector mirror,
wherein, in at least a portion of a region through which the extreme ultraviolet radiation passes through, a length of the foils in a direction parallel to the main axis and a direction of passage of the extreme ultraviolet radiation is shorter in positions close to the main axis than in positions distant from the main axis.

4. The device of claim 3, wherein a distance from the light source to edges of a foil of the plurality of foils that faces the light source is greater in positions close to the main axis than in positions distant from the main axis.

5. The device of claim 3, a central support to which the foils are connected, wherein the central support is located on the main axis so that the positions of the shorter length of the foils is close to the central support and the length of the foils is longer at positions remote from said central support.

6. The foil trap of claim 1, a central support to which the foils are connected, wherein the central support is located on the main axis so that the positions of the shorter length of the foils is close to the central support and the length of the foils is longer at positions remote from said central support.

* * * * *